United States Patent
Hu et al.

(10) Patent No.: US 7,759,678 B2
(45) Date of Patent: Jul. 20, 2010

(54) DIODE EMPLOYING WITH CARBON NANOTUBE

(75) Inventors: Chun-Hua Hu, Beijing (CN); Chang-Hong Liu, Beijing (CN); Shou-Shan Fan, Beijing (CN)

(73) Assignees: Tsinghua University, Beijing (CN); Hon Hai Precision Industry Co., Ltd., Tu-Cheng, Taipei Hsien (TW)

( * ) Notice: Subject to any disclaimer, the term of this patent is extended or adjusted under 35 U.S.C. 154(b) by 0 days.

(21) Appl. No.: 12/381,030

(22) Filed: Mar. 5, 2009

(65) Prior Publication Data
US 2010/0006829 A1    Jan. 14, 2010

(30) Foreign Application Priority Data
Jul. 11, 2008    (CN) .................. 2008 1 0068457

(51) Int. Cl.
*H01L 35/24* (2006.01)
(52) U.S. Cl. .................. 257/40; 257/14; 257/485; 257/9; 257/471

(58) Field of Classification Search .................. 257/40, 257/14, 485, 9, 471
See application file for complete search history.

(56) References Cited
U.S. PATENT DOCUMENTS
7,372,109 B2    5/2008    Chen et al.

*Primary Examiner*—Long Pham
(74) *Attorney, Agent, or Firm*—D. Austin Bonderer

(57) ABSTRACT

A diode includes an organic composite plate, a pressing element, a first electrode, and a second electrode. The organic composite plate has a plurality of carbon nanotubes uniformly distributed therein and includes a first portion and a second portion opposite to the first portion. The pressing element is disposed on the first portion of the organic composite plate. The first and second electrodes are electrically connected to the first and second portions of the organic composite plate, respectively. The diode employed with the carbon nanotubes has a changeable characteristic, such as voltage, current, via controlling the pressure applied by the pressing element.

18 Claims, 4 Drawing Sheets

DIODE EMPLOYING WITH CARBON NANOTUBE

BACKGROUND

1. Technical Field

The present disclosure relates to diodes.

2. Discussion of the Related Art

Typically, a semiconductor rectifying diode is a circuit element for converting AC to DC, and a large number of such diodes are used for electrical equipment powered by DC or for the power supplies of electronic equipment. Recently, since most electrical and electronic equipment is now formed by semiconductors, ICs and LSIs, which save energy, it is known to use the Schottky junction diode in place of a P/N junction diode. The Schottky junction diode has a forward voltage drop as low as 0.5 to 0.6 V, and thus has low forward loss, but its reverse leakage current is much greater than that of the P/N junction diode, and so has very high reverse loss. In fact, the total of the forward and reverse losses of the Schottky junction diode is only slightly lower than that of the P/N junction diode. Additionally, it is know that the Schottky junction diode has a fixed band gap. Band gap refers to the energy difference between the top of the valence band and the bottom of the conduction band. Electrons are able to jump from one band to another resulting in high losses when enough energy is applied. Therefore, the above diodes have fixed parameters, such as current, voltage, and so on, because of the fixed band gap, which makes adjusting their use for different applications difficult.

What is needed, therefore, is a diode that can overcome the above-described shortcoming.

BRIEF DESCRIPTION OF THE DRAWINGS

The present diode is described in detail hereinafter, by way of example and description of an exemplary embodiment thereof and with references to the accompanying drawings, in which.

DETAILED DESCRIPTION

A detailed explanation of a diode according to an exemplary embodiment will now be made with references to the drawings attached hereto.

Figure 1:
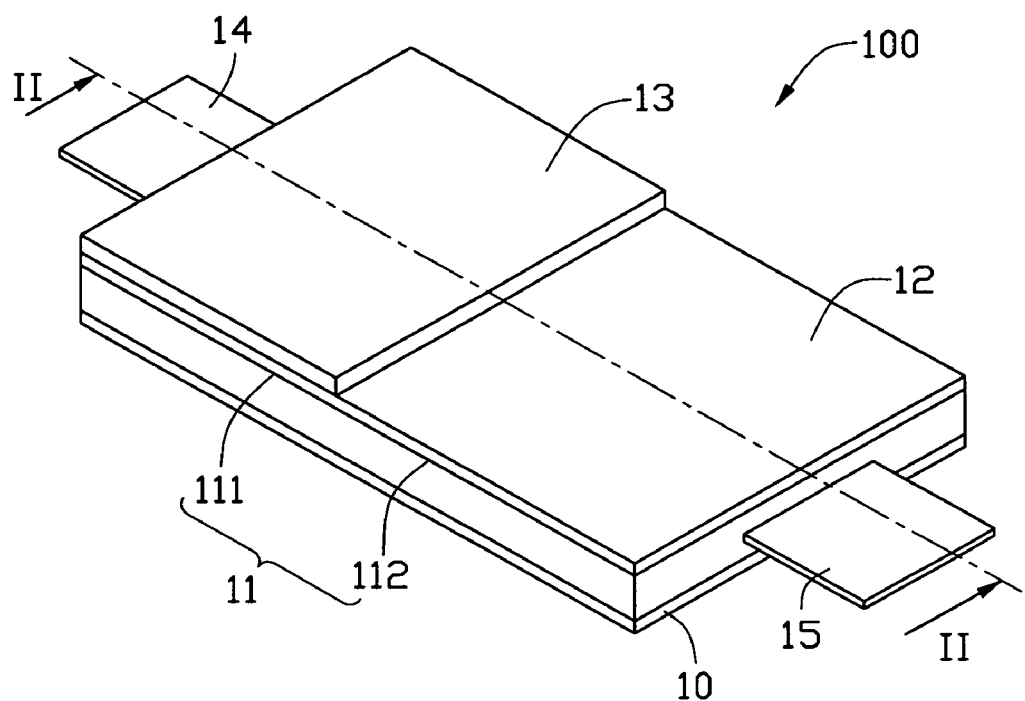
FIG. 1 is a schematic view of a diode according to an exemplary embodiment.

Referring to FIG. 1, a diode 100 according to an exemplary embodiment is shown. The diode 100 includes an insulating substrate 10, an organic composite plate 11 disposed on the insulating substrate 10, an insulating layer 12, a pressing element 13, a first electrode 14, and a second electrode 15. The insulating layer 12 is positioned between the organic composite plate 11 and the pressing element 13. The first and second electrodes 14, 15 are electrically connected to the organic composite plate 11.

The insulating substrate 10 is configured for supporting the organic composite plate 11 and has a contact area that is equal or greater than the area of the organic composite plate 11. The insulating substrate 10 has a thickness of about 200 nm to about 2 mm and is made of glass, quartz, ceramic, diamond, or plastic, resin, or the like, but not limited these. In the present embodiment, the insulating substrate 10 is made of ceramic and has a thickness of about 0.5 mm. Understandably, the insulating substrate 10 may be replaced by some other element, such as a printed circuit board (PCB). As such, the organic composite plate 11 may be directly mounted on the PCB, which may further decrease the thickness of the diode 100.

Figure 2:
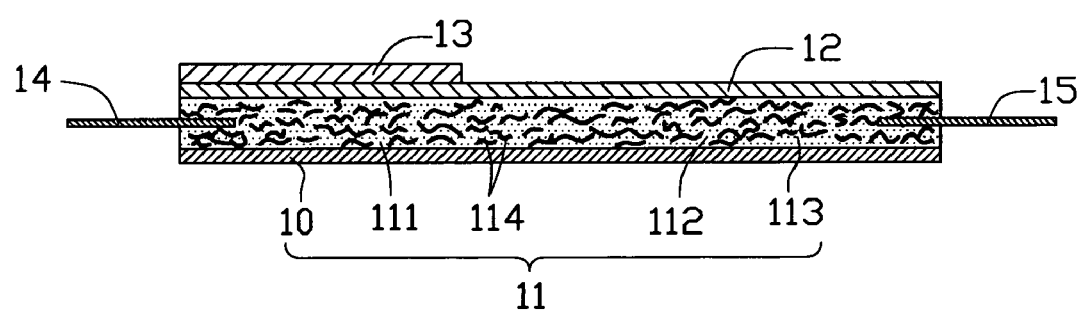
FIG. 2 is a schematic, cross-sectional view of the diode of FIG. 1, along the line II-II.

Referring also to FIG. 2, the organic composite plate 11 includes a first portion 111 and a second portion 112 opposite to the first portion 111 and comprises a base 113 and a plurality of carbon nanotubes 114 uniformly distributed in the base 113. The base 113 is made of a polymer material having a low sensitivity to temperature, such as polyethylene glycol, DION, silica, silicone rubber, epoxy resin, and acryl adhesive. In the present embodiment, the base 113 is made of silicone rubber and has a working temperature in a range from about −50 DEG C. to about 200 DEG C. The carbon nanotubes 114 may be one of a signal wall carbon nanotube (SWCNT), a double wall carbon nanotube (DWCNT), or a multi wall carbon nanotube (MWCNT). When the carbon nanotubes 114 are selected from the SWCNT, the diameter of the SWCNT may range from about 0.5 nm to about 50 nm. When the carbon nanotubes 114 are selected from the DWCNT, the diameter of the DWCNT may range from about 1 nm to about 50 nm. And when the carbon nanotubes 114 are selected from the MWCNT are selected from the MWCNT, the diameter of the DWCNT may range from about 1 nm to about 200 nm. The thickness of the carbon nanotubes 114 may ranges from about 0.5 nm to about 10 nm. In the present embodiment, the carbon nanotubes 114 are SWCNT and each have a diameter of about 0.5 nm to about 10 nm and a thickness of 0.2 mm. The percentage of weight of the carbon nanotubes 114 in the organic composite plate 11 may range from about 0.001% to about 30% and, in particular, from about 0.01% to about 4%. In the present embodiment, the percent weight of the carbon nanotubes 114 is about 1%.

The pressing element 13 is disposed on the first portion 111 of the organic composite plate 11 and configured for pressing the first portion 111 at a predetermined pressure to deform the carbon nanotubes 114. The pressing element 13 may have a thickness of about 10 nm to about 1 cm and may be made of passivation material, such as metals, glass, ceramic, polymer, or the like. In the present embodiment, the pressing element 13 has a thickness of about 500 nm and is made of ceramic.

The insulating layer 12 is configured for insulating the organic composite plate 11 from the pressing element 13. The insulating layer 12 may have a contact area that is equal to or greater than the area of the pressing element 13 and a thickness of about 10 nm to about 1 cm. The insulating layer 12 may be selected from flexible materials, such as resin or plastic. In the present embodiment, the insulating layer 12 has a thickness of about 200 nm and is made of plastic.

The first electrode 14 is electrically connected to the first portion 111 of the organic composite plate 11. And the second electrode 14 is electrically connected to the second portion 112 of the organic composite plate 11. The first and second electrodes 14, 15 may be fixed in place by inserting them into the organic composite plate 11 during solidification of the organic composite plate 11. Alternatively, they can be mounted on the surface of the organic composite plate 11 with the use of conductive adhesive. In the present embodiment, the first and second electrodes 14, 15 are inserted into the organic composite plate 11 during solidification. The first and second electrodes 14, 15 can be sheet or wire shaped, can have a thickness of about 10 nm to about 5 cm, and are made of conductive materials, such as copper, aluminum, palladium, platinum, gold, or their alloy. In the present embodiment, the first and second electrodes 14, 15 are planar and have a thickness of about 200 nm.

Figure 3:
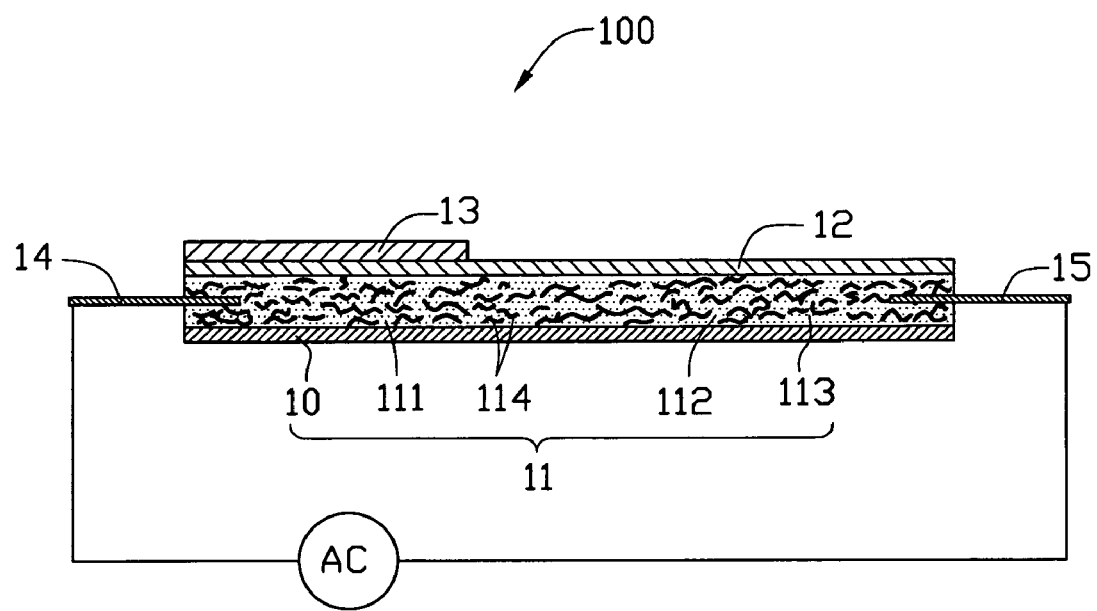
FIG. 3 is a circuit diagram of the diode of FIG. 1, with an alternating current source.

In use, when the pressing element 13 provides a pressure on the first portion 111 of the organic composite plate 11, the carbon nanotubes 112 in the first portion 111 deform, thereby increasing band gap of the carbon nanotubes 112 in the first portion 111. Thus, the first portion 111 can be caused to have a larger band gap (energy gap) than that of the second portion 112 of the organic composite plate 11, which has no pressure applied thereon. Therefore, the organic composite plate 11 can have different band gaps between the first and second portions 111, 112. As such, a hetero-junction is formed on the interface between the first and second portions 111, 112 and electrons are only able to jump from the second portion 112 to the first portion 111. Referring also to FIG. 3, a circuit diagram of the diode 100 with alternating current (AC) applied is shown. When AC is applied between the first and second electrodes 14, 15, current can only pass through from the first portion 111 to the second portion 112 and can-not pass through in an opposite direction. Thus, the diode 100 can function as a rectifier.

Figure 4:
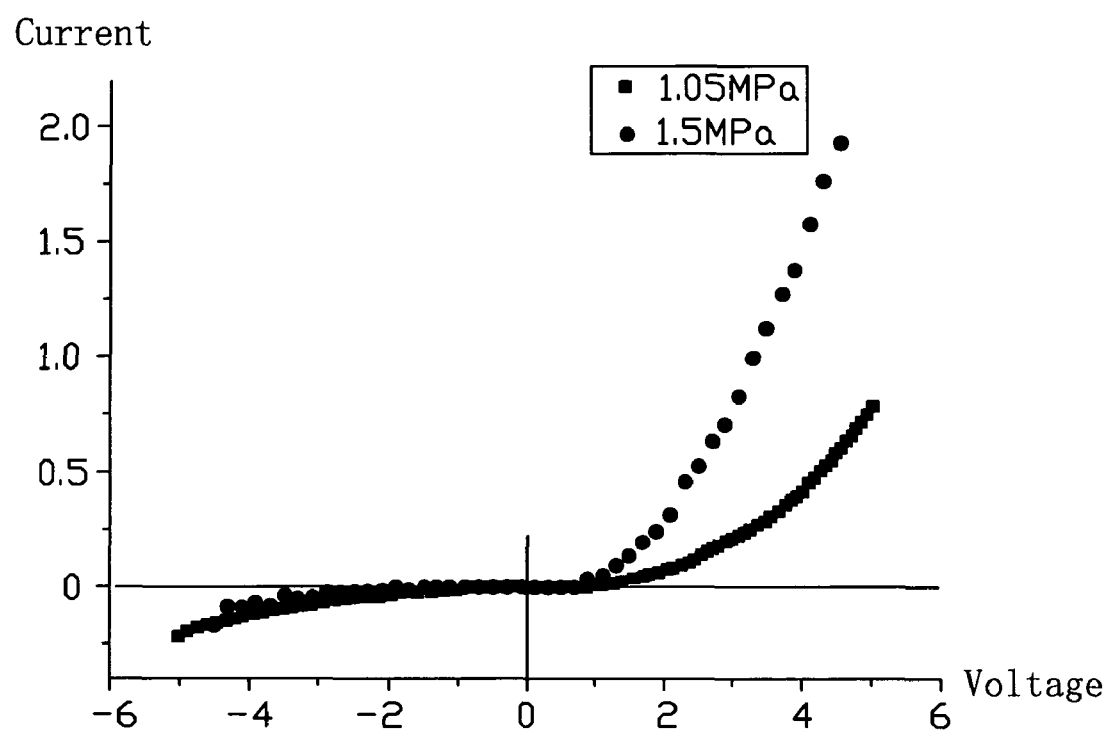
FIG. 4 is a voltage-current graph of the diode of FIG. 1, with different pressures applied to the diode by a pressing element.

Referring also to FIG. 4, a current-voltage graph of the diode 100 at two different pressures provided by the pressing element 13 is shown. In the present embodiment, the threshold voltage of the diode 100 ranges from about 0 V to about 1.5 V. It should be noted that the threshold voltage of the diode 100 may be changed by selectively changing parameters of the organic composite plate 11, such as length, thickness, weight percent of the carbon nanotubes 114, or the like. In FIG. 4, the circle-shaped dotted line stands for current-voltage graph with an applied pressure of about 1.5 megapascals (MPa), and the square-shaped dotted line stands for current-voltage graph with an applied pressure of about 1.05 MPa. The abscissa of the graph represents voltages and the ordinate of the graph represents currents. From the FIG. 4, we can see that the voltage of the diode 100 can decrease and the reverse breakdown voltage of the diode 100 with the application of greater pressure provided by the pressing element 13. Therefore, the current and voltage passing through the diode 100 can be modulated by controlling the pressure applied on the first portion 111 of the organic composite plate 11. As such, the characteristics of the diode 100 can be modified according to design needs.

As described above, the diode 100 employed with the carbon nanotubes 114 has a changeable characteristic, such as voltage, current, via controlling the pressure applied thereon. Moreover, since the carbon nanotubes 114 have good mechanical characteristic, such as flexibility, durability, lightweight, and so on, and the base 113 and the pressing element 13 is made of flexible material, it is possible to make a flexible diode, which may be applied to some flexible PCB, flexible circuit, or the like.

It is to be understood, however, that even though numerous characteristics and advantages of the present embodiments have been set forth in the foregoing description, together with details of the structures and functions of the embodiments, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A diode, comprising:
an organic composite plate comprising a base and a plurality of carbon nanotubes distributed in the base, the organic composite plate further comprising a first portion and a second portion opposite to the first portion;
a pressing element disposed on the first portion of the organic composite plate;
a first electrode electrically connected to the first portion of the organic composite plate; and
a second electrode electrically connected to the second portion of the organic composite plate.

2. The diode as claimed in claim 1, wherein the organic composite plate has a thickness of about 100 nm to about 1 cm.

3. The diode as claimed in claim 1, wherein the base comprises of polymer materials.

4. The diode as claimed in claim 3, wherein the polymer materials are selected from a group consisting of polyethylene glycol, polyester, silica, silicone rubber, epoxy resin, acryl adhesive, and combinations thereof.

5. The diode as claimed in claim 1, wherein the pressing element is made of material selected from a group consisting of metal, glass, ceramic, polymer, and combination thereof.

6. The diode as claimed in claim 1, wherein the pressing element has a thickness of about 10 nm to about 1 cm.

7. The diode as claimed in claim 1, wherein the carbon nanotubes is single wall carbon nanotubes, a double wall carbon nanotubes, or multi wall carbon nanotubes.

8. The diode as claimed in claim 1, wherein the carbon nanotube is a signal wall carbon nanotube having a length of about 100 nm to about 2 cm and a diameter of about 0.5 nm to about 10 nm.

9. The diode as claimed in claim 1, wherein a percentage by weight of carbon nanotubes in the organic composite ranges from about 0.001% to about 30%.

10. The diode as claimed in claim 1, further comprising an insulating substrate for supporting the organic composite plate.

11. The diode as claimed in claim 1, further comprising an insulating layer positioned between the pressing element and the organic composite plate.

12. The diode as claimed in claim 1, wherein the work temperature of the diode ranges from about $-50°$ C. to about $200°$ C.

13. The diode as claimed in claim 1, wherein the threshold voltage of the diode ranges from about 0 V to about 1.5 V.

14. The diode as claimed in claim 1, wherein the pressing element has a contact area that is less than the area of the organic composite plate.

15. A diode element comprising:
a organic composite plate a base and a plurality of carbon nanotubes uniformly distributed in the base, the organic composite plate further comprising a first portion and a second portion opposite to the first portion; and
a pressing element disposed on the first portion of the organic composite plate.

16. The diode element as claimed in claim 15, wherein the pressing element has a contact area that is less than the area of the organic composite plate.

17. The diode element as claimed in claim 15, further comprising an insulating substrate for supporting the organic composite plate.

18. The diode element as claimed in claim 15, further comprising an insulating layer located between the organic composite plate and the pressing element.

* * * * *